(12) United States Patent
Kemmoku

(10) Patent No.: US 8,416,389 B2
(45) Date of Patent: Apr. 9, 2013

(54) EXPOSURE APPARATUS AND METHOD OF MANUFACTURING DEVICE

(75) Inventor: Hiromi Kemmoku, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 650 days.

(21) Appl. No.: 12/620,471

(22) Filed: Nov. 17, 2009

(65) Prior Publication Data

US 2010/0123888 A1 May 20, 2010

(30) Foreign Application Priority Data

Nov. 19, 2008 (JP) .................................. 2008-296037

(51) Int. Cl.
 *G03B 27/52* (2006.01)
 *G03B 27/42* (2006.01)
 *G03B 27/54* (2006.01)

(52) U.S. Cl.
 USPC .................................. 355/55; 355/53; 355/67

(58) Field of Classification Search ............ 355/53, 355/55, 67, 71, 77
See application file for complete search history.

(56) References Cited

U.S. PATENT DOCUMENTS

| 6,013,401 A * | 1/2000 | McCullough et al. .......... 430/30 |
| 6,538,723 B2 * | 3/2003 | Hagiwara et al. ............... 355/67 |

FOREIGN PATENT DOCUMENTS

| JP | 62193125 A | 8/1987 |
| JP | 07-029810 A | 1/1995 |
| JP | 2005-167232 A | 6/2005 |
| JP | 2005-175040 A | 6/2005 |
| JP | 2005-191495 A | 7/2005 |
| WO | 2005/048326 A | 5/2005 |
| WO | 2007/145139 A | 12/2007 |

* cited by examiner

*Primary Examiner* — Peter B Kim

(74) *Attorney, Agent, or Firm* — Canon U.S.A., Inc. IP Division

(57) ABSTRACT

An apparatus, which scans an original and a substrate relative to light slit-shaped on the original and on the substrate, comprises an adjusting device configured to adjust a distribution of a width of the light slit-shaped, the width being a width in a scanning direction, the distribution being a distribution in a perpendicular direction perpendicular to the scanning direction, and a controller. The controller is configured to obtain information representing a relationship between a position on the substrate and a target dose, calculate a distribution of the target dose in the perpendicular direction with respect to each of the shot regions based on the relationship represented by the obtained information, and control the adjusting device so as to achieve the calculated distribution of the target dose with respect to each of the shot regions.

5 Claims, 7 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

A reduction projection exposure apparatus has been conventionally employed in a process of manufacturing a semiconductor element formed from an ultrafine pattern. This apparatus reduces and projects a circuit pattern drawn on a reticle (mask) onto a substrate such as a wafer coated with a photoresist, thereby exposing the substrate. Along with an improvement in packing density of semiconductor elements, it is demanded to further miniaturize circuit patterns. It is also demanded to realize an exposure apparatus which can uniform the finished pattern dimension (pattern line width).

A conventional exposure apparatus exposes a photoresist applied on a substrate with a dose appropriate to expose the photoresist. An exposure apparatus of the step & repeat scheme repeats exposure with a constant dose while moving across shot regions within the substrate plane. Unfortunately, even when the photoresist is repeatedly exposed with a constant dose in each shot within the substrate plane, a difference (pattern line width error) occurs between the line width of the obtained pattern and that of a design pattern. To maintain a given uniformity of the pattern line width, a variety of exposure methods of correcting the dose in accordance with each shot have been disclosed. One disclosed method controls the dose as an nth-degree polynomial function of the distance (position) from a predetermined position (origin) within the substrate plane to each shot.

Also, Japanese Patent Laid-Open No. 62-193125 proposes a technique of adjusting the slit width so as to reduce the unevenness of exposure attributed to a difference in illuminance in the non-scanning direction within the slit in an exposure apparatus of the step & scan scheme.

In the conventional techniques, although dose adjustment is often performed, it does not aim to uniform the line width distribution in a shot region. A conventional exposure apparatus which repeats exposures with a constant dose for respective shot regions cannot precisely reduce a pattern line width error in each shot region.

SUMMARY OF THE INVENTION

The present invention provides, for example, an exposure apparatus advantageous in line width uniformity of a pattern in a shot region.

According to an aspect of the present invention, there is provided an exposure apparatus which scans an original and a substrate relative to light slit-shaped on the original and on the substrate to expose each of shot regions on the substrate to light via the original, the apparatus comprising: an adjusting device configured to adjust a distribution of a width of the light slit-shaped, the width being a width in a scanning direction as a direction of the scanning, the distribution being a distribution in a perpendicular direction as a direction perpendicular to the scanning direction; and a controller configured to control the adjusting device, wherein the controller is configured to obtain information representing a relationship between a position on the substrate and a target dose, calculate a distribution of the target dose in the perpendicular direction with respect to each of the shot regions based on the relationship represented by the obtained information, and control the adjusting device so as to achieve the calculated distribution of the target dose with respect to each of the shot regions.

Further features of the present invention will become apparent from the following description of exemplary embodiments with reference to the attached drawings.

DESCRIPTION OF THE EMBODIMENTS

A scanning exposure apparatus according to the present invention will be described below with reference to the accompanying drawings.

Figure 1:
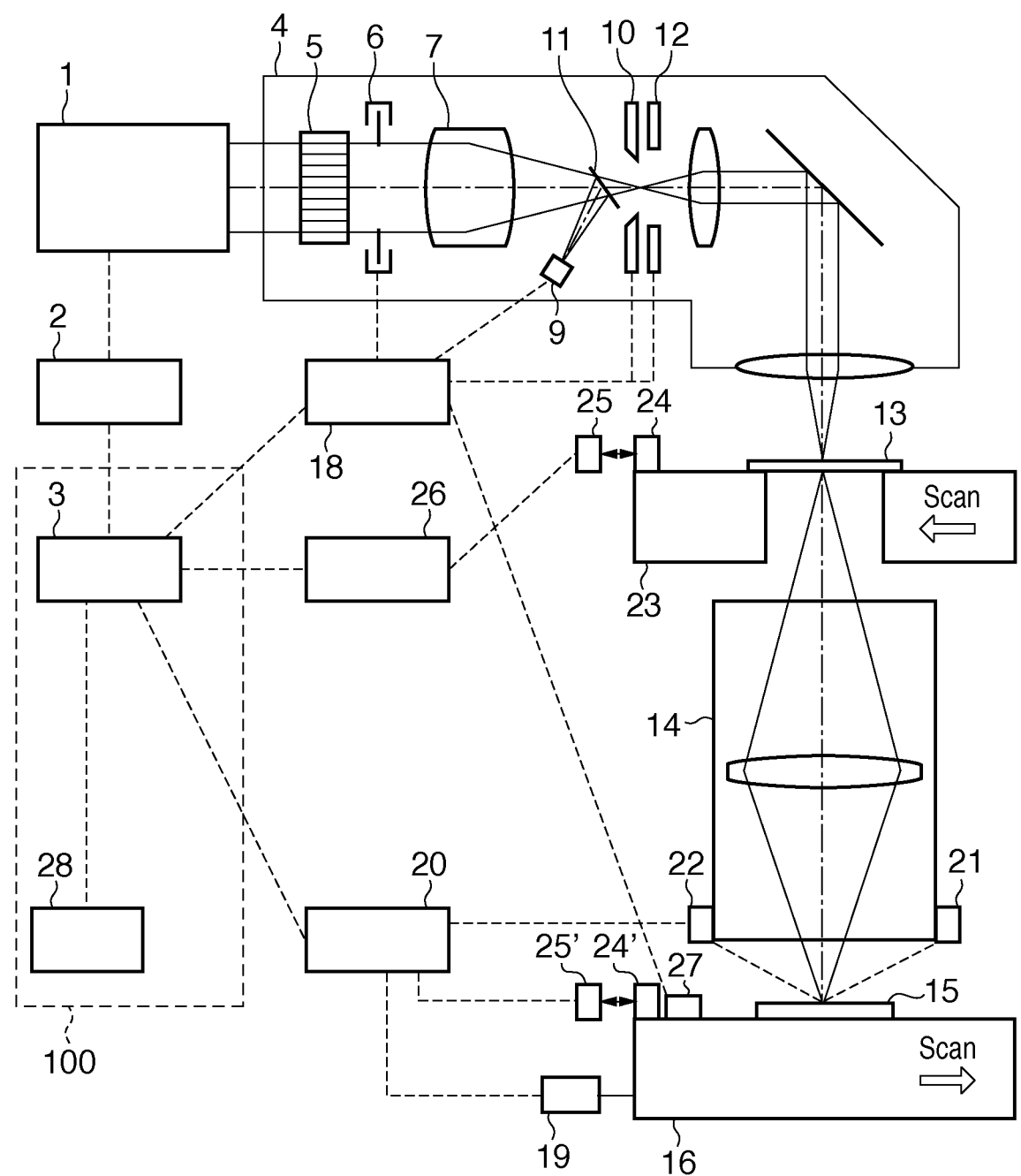
FIG. 1 is a diagram showing the schematic arrangement of a scanning exposure apparatus according to the present invention.

FIG. 1 is a diagram showing the schematic arrangement of a scanning exposure apparatus of the step & scan type according to the first embodiment. The scanning exposure apparatus scans an original and a substrate with respect to slit-shaped light on the original and on the substrate to expose shot regions on the substrate via the original. A laser light source 1 which contains a gas such as ArF and emits laser light emits light with a wavelength of 193 nm in the far-ultraviolet range. The laser light source 1 includes, for example, a front mirror which constitutes a resonator, a narrow-band module, a monitor module, and a shutter. The narrow-band module includes, for example, a diffraction grating and prism, and narrows the exposure wavelength range. The monitor module includes a spectroscope and detector, and monitors the spectral width.

A laser controller 2 controls, for example, a gas exchange operation, wavelength stabilization, and discharge/applied voltage of the laser light source 1. In this embodiment, this control is not performed solely by the laser controller 2 but is enabled in response to a command from a main controller 3. The main controller 3 is connected to the laser controller 2 via an interface cable and controls the overall exposure apparatus.

Laser light emitted by the laser light source 1 is shaped into a predetermined shape via a shaping optical system (not shown) of an illumination optical system 4. After that, the shaped light enters an integrator lens 5 to form secondary light sources. A condenser lens 7 has a function of changing the illuminance distribution on an original (reticle) 13. The condenser lens 7 directs the light beams from the secondary light sources to a variable slit 10 having a variable aperture width to Kohler-illuminate the variable slit 10. The variable slit 10 has a variable aperture width, as will be described later.

An aperture stop 6 of the illumination optical system 4 has a nearly circular aperture. An illumination system controller 8 can set the diameter of the aperture of the aperture stop 6 and, eventually, the numerical aperture (NA) of the illumination optical system 4 to desired values. In this case, the ratio of the numerical aperture of the illumination optical system 4 to that of a projection optical system 14 (to be described later) is the coherence factor (σ value). This means that the illumination system controller 8 can set the σ value by controlling the aperture stop 6 of the illumination optical system 4.

A half mirror 11 is inserted in the optical path of the illumination optical system 4. Exposure light which illuminates the reticle 13 is partially reflected and extracted by the half mirror 11. A photosensor 9 is inserted in the optical path of the light reflected by the half mirror 11, and generates an output corresponding to the intensity of the exposure light (exposure energy). The output from the photosensor 9 is converted into exposure energy per pulse by an integrating circuit (not shown). The obtained exposure energy is input to the main controller 3 which controls the overall exposure apparatus via the illumination system controller 8.

An aperture stop (not shown) having a nearly circular aperture is located on the pupil plane of the projection optical system 14 (the Fourier transform plane of the reticle 13). The diameter of the aperture of the aperture stop can be set to a desired value under the control of a driving mechanism such as a motor.

Figure 2:
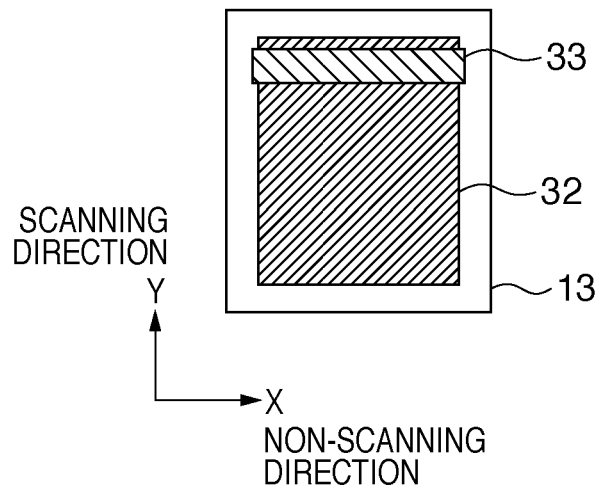
FIG. 2 is a partial explanatory view of FIG. 1.

A pattern 32 corresponding to the circuit pattern of a semiconductor element is formed on the reticle 13 and illuminated by the illumination optical system 4. A two-dimensional variable blade 12 includes a movable light-shielding member located in a plane perpendicular to the optical axis to be able to arbitrary set the irradiation region on the pattern surface of the reticle 13. FIG. 2 shows the state in which the reticle 13 is illuminated. Slit-shaped light 33 shielded by the variable blade 12 illuminates a part of the pattern 32 of the reticle 13, which is indicated by a hatched region. The projection optical system 14 shown in FIG. 1 reduces and projects that part of the pattern 32 onto a substrate 15, coated with a photoresist, at a reduction magnification β (β is, for example, ¼). At this time, the reticle 13 and substrate 15 are scanned with respect to the slit-shaped light 33 in opposite directions at a speed ratio equal to the reduction magnification β. Exposure of the substrate 15 to a multiple of pulses emitted by the laser light source 1 is repeated. As a result, the pattern 32 on the entire surface of the reticle 13 is transferred to shot regions (which are to be also simply referred to as shots and correspond to one or a plurality of chip regions) on the substrate 15. In FIG. 2, an axis parallel to the optical axis of the projection optical system 14 is assumed to be the Z-axis. Then, of two axes which are perpendicular to the Z-axis and are orthogonal to each other, an axis parallel to the scanning direction of the substrate 15 or a substrate stage 16 (to be described later) is assumed to be the Y-axis, and the remaining axis is assumed to be the X-axis.

The substrate stage 16 can three-dimensionally move while holding the substrate 15, that is, can move in the optical axis direction (Z direction) of the projection optical system 14 and in a plane (X-Y plane) perpendicular to the that optical axis direction. A laser interferometer 25' measures the distance between itself and a moving mirror 24' fixed on the substrate stage 16, thereby detecting the position of the substrate stage 16 in the X-Y plane. With the same token, a laser interferometer 25 measures the distance between itself and a moving mirror 24 fixed on the reticle stage 23. A substrate stage controller 20 under the control of the main controller 3 detects the position of the substrate stage 16 by the laser interferometer 25', and controls a driving mechanism 19 such as a motor to move the substrate stage 16 to a predetermined position in the X-Y plane. Also, a light projecting optical system 21 of a focus detector projects a plurality of light beams, formed from non-exposure light which doses not expose a photoresist on a substrate, onto the substrate 15. These plurality of light beams are focused on and reflected by the substrate 15. The light beams reflected by the substrate 15 enter a detecting optical system 22 of the focus detector. The detecting optical system 22 includes a plurality of light receiving devices for position detection in one-to-one correspondence with the respective reflected light beams. The detecting optical system 22 is configured such that an imaging optical system sets the light receiving surface of each light receiving device for position detection to be conjugate to the corresponding light beam reflection point on the substrate 15. A positional shift of each detection portion (corresponding to each reflection point) on the surface of the substrate 15 in the optical axis direction of the projection optical system 14 is measured as a positional shift of the incident light beam on the corresponding light receiving device for position detection in the detecting optical system 22.

Figure 3A:
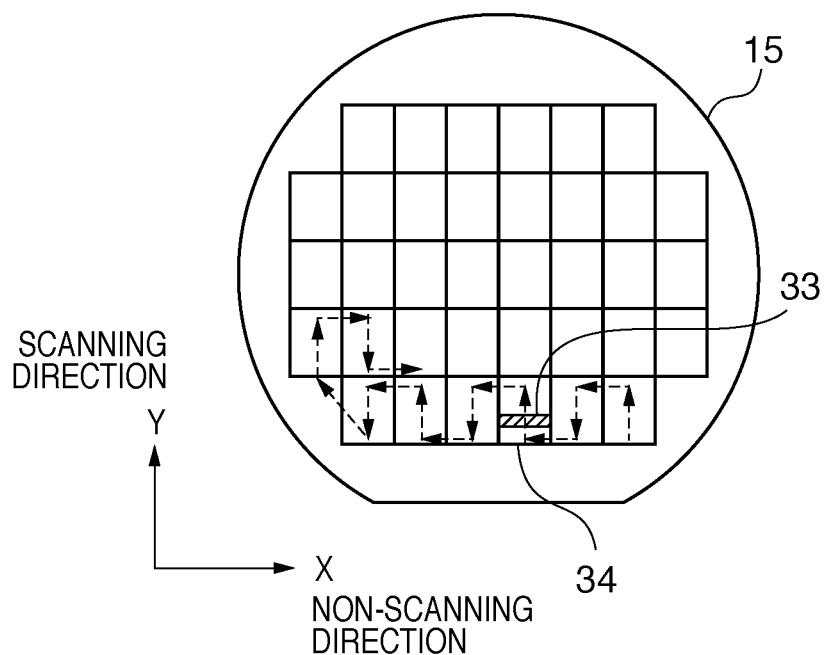
FIGS. 3A and 3B are views showing a scan exposure of a substrate to light.
Figure 3B:
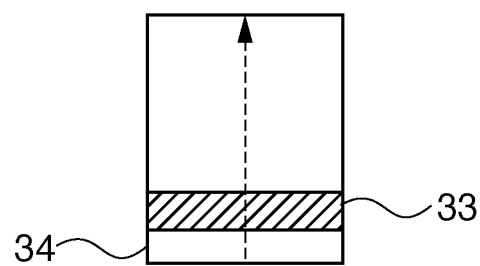

In this embodiment, the reticle 13 and substrate 15 are positioned in a predetermined relationship first. Based on a sync signal from the main controller 3, the laser controller 2, the substrate stage controller 20, and a reticle stage controller 26 perform a scan exposure of a shot region on the substrate 15 to light by transferring the pattern 32 on the entire surface of the reticle 13 to the shot region. After that, the substrate stage 16 drives the substrate 15 in the X-Y plane by a predetermined amount, and the controllers 2, 20, and 26 similarly perform a scan exposure of other shot regions on the substrate 15. All shot regions are exposed step by step using the so-called step & scan scheme by repeating the above-mentioned operation. FIG. 3A shows the state in which a scan exposure of each shot region within the plane of the substrate 15 to light is performed while repeating the step & scan movement in the order indicated by broken arrows. Reference numeral 34 denotes a shot region (the range within which the pattern 32 of the reticle 13 is transferred onto the substrate 15 by exposure by one scanning); and 33, slit-shaped light. Also, the scanning direction is assumed to be the Y direction, and a direction perpendicular to the scanning direction is assumed to be the non-scanning direction X. FIG. 3B is an enlarged view showing the shot region 34. The slit-shaped light 33 is exposure light which forms an image upon passing through the projection optical system 14. In this embodiment, the dose distribution in the X direction (non-scanning direction) in the shot region 34 is adjusted by controlling the distribution, in the X direction (non-scanning direction), of the width of the slit-shaped light 33 in the Y direction for each shot region 34.

A method of adjusting the dose in each shot region in the scanning exposure apparatus shown in FIG. 1 will be explained next. The dose is one condition important in determining the finished dimension of a pattern transferred to the shot region 34 when a scan exposure of the shot region 34 on the substrate 15 to light is performed via the pattern 32 formed on the reticle 13. The dose adjustment means herein adjustment of the dose distribution in the non-scanning direction in a shot. The distribution, in the non-scanning direction, of the accumulated amount of applied (projected) energy, that is, the dose of applied (projected) exposure light is adjusted for each shot region 34 by controlling the intensity distribution of the slit-shaped light 33 in the non-scanning direction (the width of the slit-shaped light 33 in the scanning direction). The variable slit (to be also referred to as a variable slit mechanism or an adjusting device hereinafter) 10 which adjusts the dose distribution in the non-scanning direction (X-axis direction) will be explained first.

Figure 4:
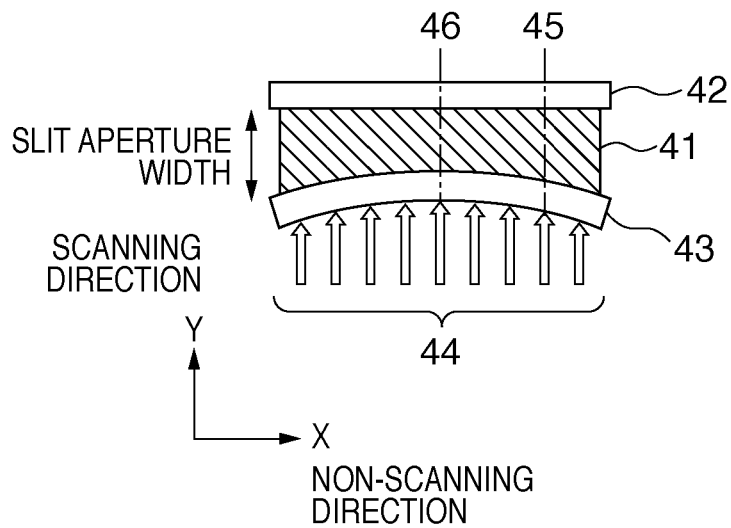
FIG. 4 is a view showing the arrangement of a variable slit according to the first embodiment of the present invention.

FIG. 4 is a schematic view showing the variable slit 10 according to the first embodiment. Japanese Patent Laid-Open No. 62-193125 discloses the principle of adjusting the dose by the variable slit 10. In this principle, the aperture width of the variable slit 10 is partially changed to adjust the doses in respective portions to be exposed at different aperture widths. Illumination light which Kohler-illuminates the variable slit 10 shown in FIG. 4 forms an image of the slit-shaped light 33 on the substrate 15 upon passing through an aperture 41 of the variable slit 10. The slit-shaped light 33 is integrated by scanning to generate a light intensity distribution corresponding to the slit aperture width on the substrate 15. The variable slit 10 includes, for example, a curved movable portion 43 and fixed portion 42 which serve as a leaf spring tilted with respect to a plane perpendicular to the optical axis. The curved movable portion 43 is connected to a plurality of pushrods 44. The curved movable portion 43 has a mechanism in which its connected portions can selectively move in the Y direction (scanning direction).

The curved movable portion 43 and fixed portion 42 with a leaf spring shape constitute a pair of light-shielding members. Each of the plurality of pushrods 44 serves as an actuator which displaces the connected portion of the light-shielding member (leaf spring) in its open edge. The actuator deforms the open edge of the curved movable portion 43 so that at least a part of that open edge has a curved shape.

Figure 5A:
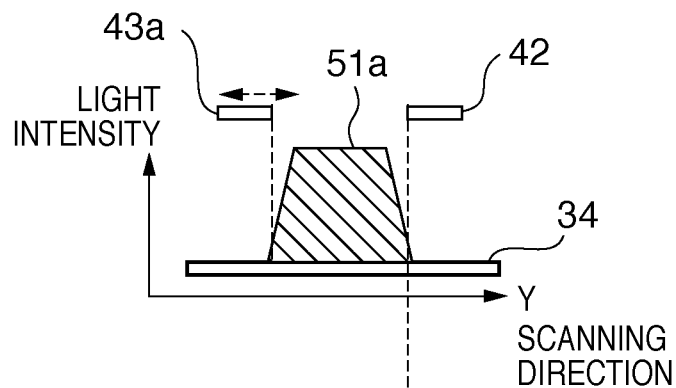
FIGS. 5A and 5B are charts showing a change in exposure profile attributed to the variable slit according to the first embodiment.
Figure 5B:
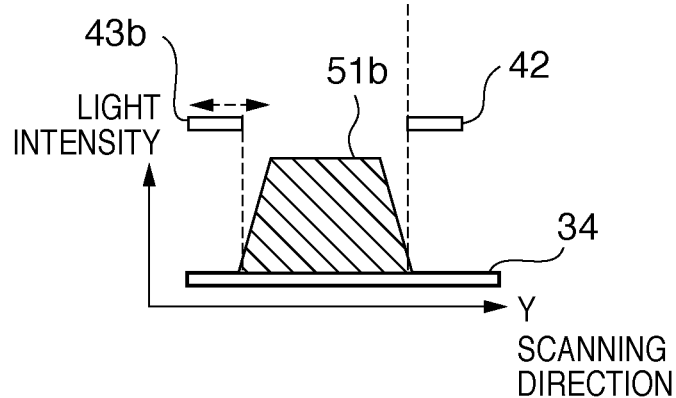

FIG. 4 exemplifies a case in which the edge of the curved movable portion 43 is positioned to have a quadratic curve shape. A central position 46 is aligned with the center of the shot region 34 in the non-scanning direction. FIGS. 5A and 5B schematically show the light intensity profiles obtained upon projecting beams of the slit-shaped light 33, indicated by broken lines 46 and 45 in FIG. 4, to the shot region 34 on the substrate 15. In FIGS. 5A and 5B, the abscissa indicates the scanning direction Y, and the ordinate indicates the light intensity. The dose in the shot region 34 is determined by light intensity profile areas 51a and 51b. A movable portion 43b of the variable slit 10, shown in FIG. 5B, is positioned such that its aperture width increases with reference to that of a movable portion 43a of the variable slit 10 shown in FIG. 5A. Hence, the light intensity profile areas 51a and 51b satisfy a relation 51a<51b. This means that a dose distribution in which the dose near the periphery of the curved movable portion 43 is higher than that at the center of the curved movable portion 43 in the non-scanning direction (X-axis direction) is obtained.

Figure 6:
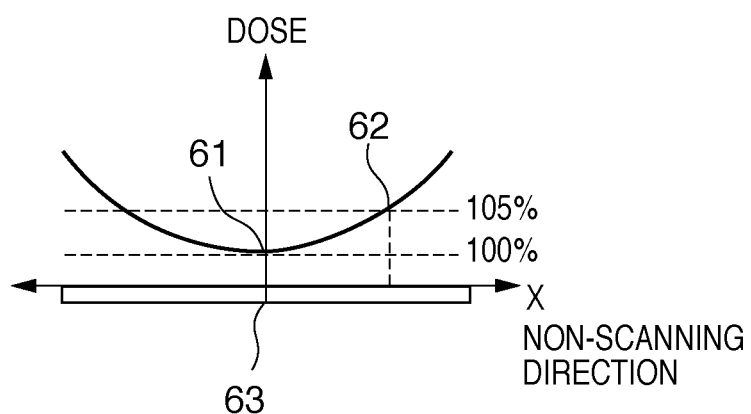
FIG. 6 is a graph showing the dose distribution in the non-scanning direction in a shot region according to the first embodiment.

FIG. 6 is a schematic graph showing the dose distribution in the non-scanning (X-axis) direction when the edge of the curved movable portion 43 of the variable slit 10 shown in FIG. 4 is positioned to have a quadratic curve shape. A dose distribution having a quadratic curve profile is formed in accordance with the aperture width determined by the movable portion 43 positioned to have a quadratic curve shape by the pushrods 44, and the fixed portion 42. Assume herein that a dose 61 at the center 63 in the non-scanning (X-axis) direction is 100. Then, a dose 62 at a position spaced apart from the center 63 in the X-axis direction by a certain distance can be relatively adjusted to 105. As long as the relationships between the positions on the curved movable portion 43 of the variable slit 10 (the positions of the plurality of pushrods 44)

and the dose distributions are measured and stored in advance, it is possible to precisely adjust the dose distribution in the non-scanning (X-axis) direction.

Figure 7:
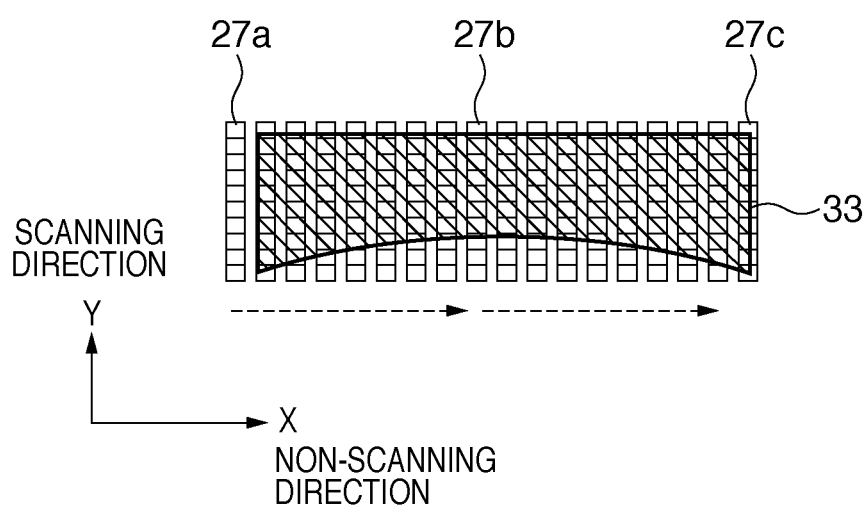
FIG. 7 is a view showing dose distribution measurement according to the first embodiment.

A dose detector 27 mounted on the substrate stage 16, shown in FIG. 1, is used as a detector which detects the dose of the slit-shaped light 33 on the substrate 15. The dose detector 27 can measure the dose distribution of the slit-shaped light 33 by moving the substrate stage 16. FIG. 7 is a schematic view showing the sequence of measuring, by the dose detector 27, the slit-shaped light 33 on the substrate 15 at the variable slit positions shown in FIG. 4. The dose detector 27 according to this embodiment is a line sensor having photosensor cells which are equidistantly arranged on it in the scanning (Y-axis) direction. The dose detector 27 measures the dose by detecting the slit-shaped light 33 formed on the substrate 15 by a predetermined number of pulsed light beams having a predetermined energy, and accumulating (integrating) the light intensity distribution in the scanning (Y-axis) direction. The dose distribution in the X-axis direction at a predetermined pushrod position on the curved movable portion 43 can be measured by repeatedly measuring the dose while finely moving the substrate stage 16 step by step in the non-scanning (X-axis) direction (the direction of 27a→27c). As long as a plurality of relationships between the variable slit positions (shapes) and the dose distributions are measured and stored in a storage unit (not shown) of the main controller 3 in advance prior to an exposure process, there is no need to repeat dose distribution measurement for each exposure process. The relationship between the variable slit position and the dose distribution means herein, for example, the relationship between the distribution, in the non-scanning direction, of the dose measured using the detector, and that, in the non-scanning direction, of the variable slit width in the scanning direction.

Figure 8A:
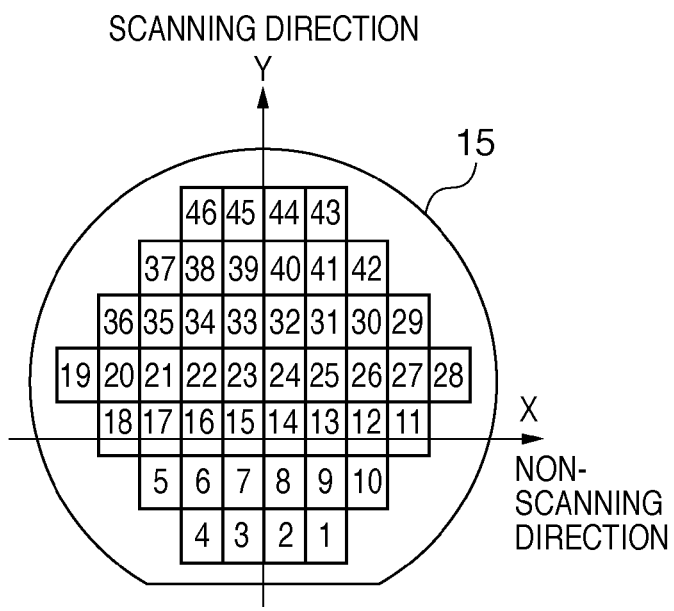
FIGS. 8A to 8D are views for explaining the procedure of dose adjustment according to the first embodiment.

The procedure of improving the line width uniformity in a shot region by adjusting the dose distribution in the shot region will be explained in detail next. FIG. 8A is a view schematically showing an array of shots 1 to 46 in exposing the substrate 15 using the step & scan scheme described previously. In FIG. 8A, the Y-axis direction is the scanning direction in which the substrate 15 is scanned with respect to the slit-shaped light 33, and the X-axis direction is the non-scanning direction perpendicular to the Y-axis direction. The intersection of the X- and Y-axes is the center of the substrate 15. In this embodiment, the relationship between the position on the substrate 15 and the target dose is given by a quadratic polynomial function:

$$\text{Dose}(X,Y)[J/m^2] = a \cdot X^2 + b \cdot Y^2 + c \cdot X \cdot Y + d \cdot X + e \cdot Y + f \quad (1)$$

where X is the coordinate in the non-scanning direction assuming the center of the substrate 15 as the origin, Y is the coordinate in the scanning direction assuming the center of the substrate 15 as the origin, and Dose(X, Y) is the dose [J/m²] at the coordinate position (X, Y).

Equation (1) determines the target dose in accordance with the distance from the center of the substrate 15.

The line width of a pattern transferred onto a substrate by a scan exposure of the substrate to light, and the film thickness of the resist on the substrate have a correlation. Also, the film thickness distribution of the resist on the substrate can be accurately approximated by equation (1). As can be seen from the foregoing description, equation (1) is useful for describing the target dose to improve the line width uniformity on the substrate. However, a useful relation between the position on the substrate 15 and the target dose is not limited to equation (1), and can be set in accordance with the circumstances of an actual lithography process.

In the shot array shown in FIG. 8A, substituting the coordinate position (X, Y) of the central position in each shot region into equation (1) yields a target dose at the central position in each shot region. Note that the coefficients a to f in equation (1) can be calculated by approximation using a quadratic surface in accordance with the distribution of an optimum dose on the substrate 15, which is calculated in advance so as to uniform the line width. Prior to the start of a scan exposure of the substrate 15 to light, the scanning exposure apparatus according to this embodiment inputs, information on each shot region position/shot region viewing angle (size) and information on the dose distribution described by equation (1), to an obtaining unit 28.

Figure 8B:
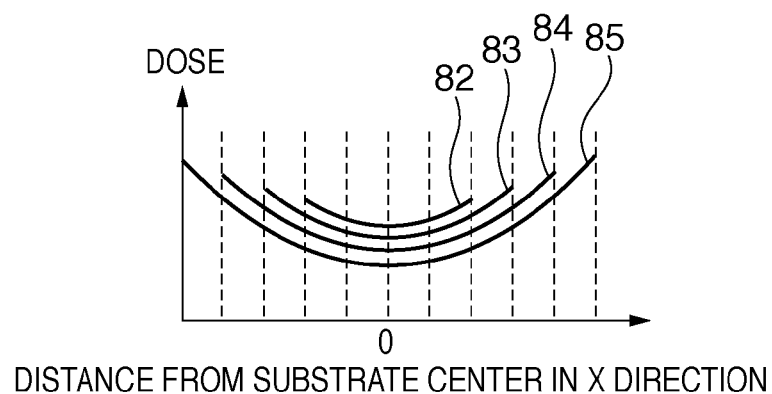
Figure 8C:
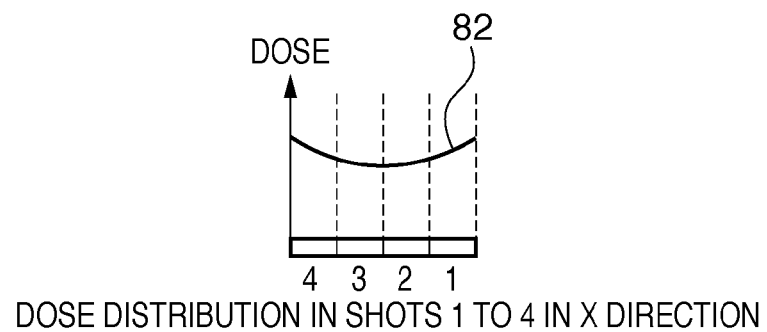

FIG. 8B shows the target dose distribution in the X-axis direction on the substrate 15. In FIG. 8B, the abscissa indicates the X-coordinate, and the ordinate indicates the target dose. Curves 82, 83, 84, and 85 describe the target dose distributions in the non-scanning (X-axis) directions in correspondence with the row of shots 4 to 1, that of shots 5 to 10, that of shots 18 to 11, and that of shots 19 to 28, respectively. FIG. 8C shows the target dose distribution in each shot region in the row of shots 4 to 1 in more detail. Based on the information on the positions and sizes of shot regions 1 to 46, and the information on a target dose distribution which has a quadratic curve profile and is given by equation (1), the main controller 3 of the scanning exposure apparatus respectively calculate shot-region-specific target dose distributions E[shot 1] to E[shot 46]. Next, in accordance with the target dose distributions E[shot 1] to E[shot 46] for respective shot regions, the main controller 3 invokes the information representing the relationships between the positions of a plurality of push rods 44 connected to the movable portion 43 of the variable slit 10 and their corresponding dose distributions, measured and stored in advance. Based on that information, the main controller 3 calculates variable slit movable portion positions Pi[shot 1] to Pi[shot 46] for respective shot regions. Note that i is a suffix corresponding to each pushrod 44. As a matter of course, the variable slit movable portion position Pi may be set for each shot region through the measurement by the dose detector 27, described previously with reference to FIG. 7.

The main controller 3 approximates the relationship of the dose distribution to the variable slit position in equation (1), obtained by the obtaining unit 28, by a linear function to calculate the target dose distribution in the non-scanning direction for each shot region. The main controller 3 controls a variable slit mechanism (adjusting device) in accordance with the calculated target dose distribution. The main controller 3 controls the adjusting device so as to adjust the distribution, in the non-scanning direction, of the width of the variable slit in the scanning direction for each shot region. This results in an improvement in line width uniformity of a pattern transferred to a shot region through a scan exposure of the shot region to light. A controller calculates the target dose distribution in the non-scanning direction in each shot region based on information representing the relationship between the position on the substrate and the target dose. The main controller 3 and obtaining unit 28 constitute a controller 100. The controller 100 obtains information representing the relationship between the position on the substrate and the target dose, approximates the relationship represented by the obtained information by a linear function, calculates the target dose distribution in the non-scanning direction perpendicular to the scanning direction for each shot region, and finally controls the adjusting device so as to generate the calculated target dose distribution in each shot region.

Figure 8D:
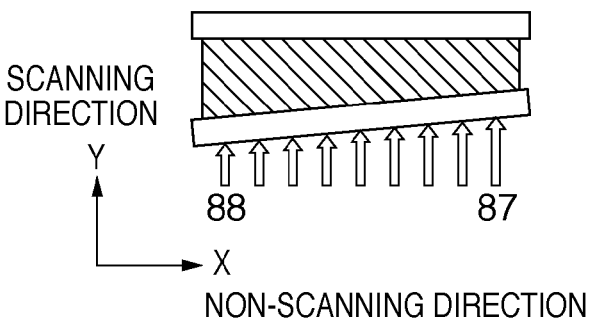

To perform a scan exposure of the Nth shot region to light by the step & scan scheme, a pushrod i is positioned at the variable slit movable portion pushrod position Pi[shot N] calculated previously. After that, the execution of a scan exposure of the Nth shot region to light makes it possible to obtain a desired dose distribution E[shot N]. FIG. 8D is a schematic view showing the variable slit movable portion pushrod position Pi[shot 4] to obtain the dose distribution E[shot 4] in shot 4. Shot 4 has a target dose distribution which increases in a direction away from the center of the substrate 15 in the −X direction. Since the target dose increases from a position 87 to a position 88 in the variable slit 10, the plurality of pushrods 44 are positioned so as to, in turn, increase the slit aperture width from the position 87 to the position 88.

Each of the plurality of pushrods 44 functions as an adjusting device which adjusts the distribution, in the non-scanning (X-axis) direction, of the width of the variable slit 10 in the scanning (Y-axis) direction.

In the first embodiment, the variable slit 10 includes the movable portion 43 and fixed portion 42 which serve as a leaf spring. The dose distribution in the non-scanning (X-axis) direction is adjusted by controlling the positions of the pushrods 44 connected to the movable portion 43. In the method according to the first embodiment, the distribution, in the X-axis direction, of the width of the slit aperture in the Y-axis direction is adjusted by independently driving the large number of pushrods 44 and adjusting their positions. Such a complex mechanism may require a given adjustment time and a high cost. In the second embodiment, the dose distribution is adjusted in a short period of time using a variable slit mechanism having a relatively simple structure.

Figure 9A:
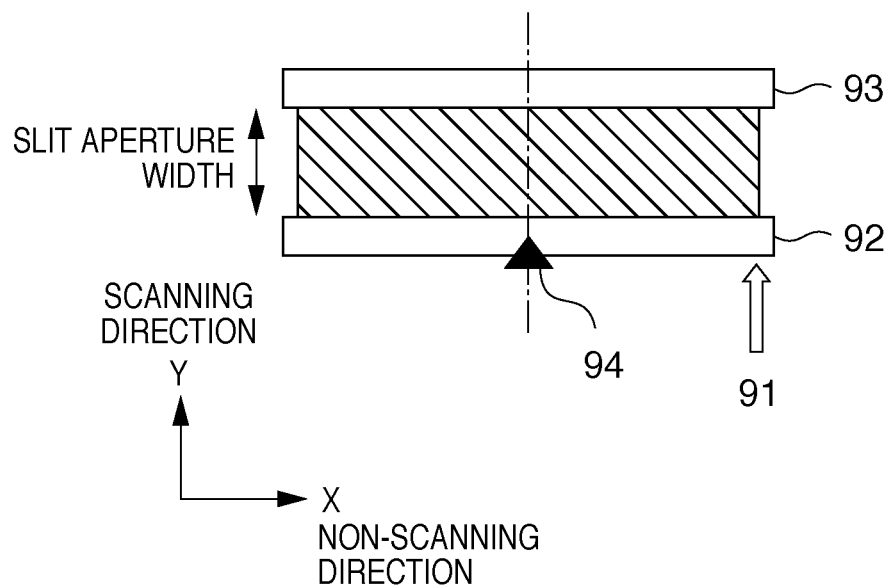
FIGS. 9A to 9C are views showing the arrangement of a variable slit according to the second embodiment.

FIG. 9A is a schematic view showing a variable slit (variable slit mechanism) 10 according to the second embodiment. A light-shielding member of a movable portion 92 (wherein reference numeral 93 is denoted as the fixed portion) of the variable slit 10 is a rotary movable portion. The rotary movable portion is connected to one pushrod 91 and rotates about a fulcrum 94, which is aligned with the central position of a shot region in the non-scanning (X-axis) direction, as the center. The pushrod 91 is an actuator which tilts at least a part of the open edge of the movable portion 92 of the variable slit 10 with respect to the X-axis direction.

Figure 9B:
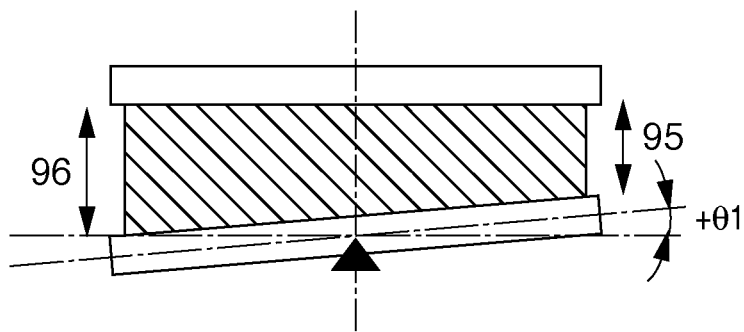
Figure 9C:
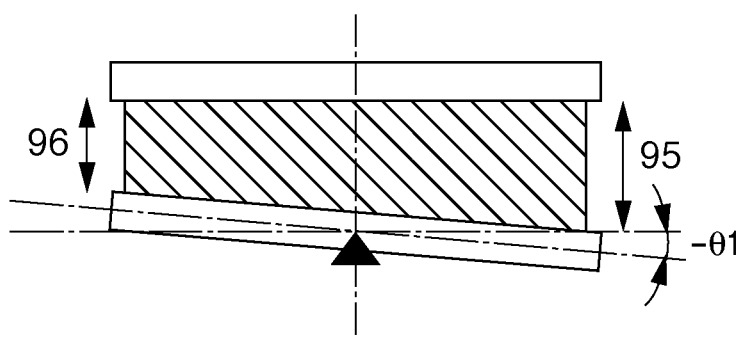
Figure 10:
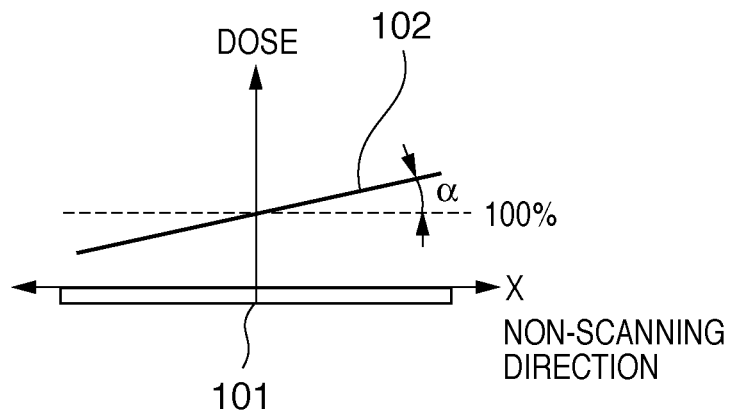
FIG. 10 is a graph showing the dose distribution according to the second embodiment.

FIG. 9B exemplifies a case in which the movable portion 92 rotates through θ1 (+θ1) counterclockwise about the center (fulcrum 94). In proportion to the angle of this rotation, an aperture width 95 at the right end in the X-axis direction decreases, whereas an aperture width 96 at the left end in the X-axis direction increases. FIG. 9C exemplifies a case in which the movable portion 92 rotates through θ1 (−θ1) clockwise about the center. In contrast to the case shown in FIG. 9B, in proportion to the angle of this rotation, the aperture width 95 at the right end in the X-axis direction increases, whereas the aperture width 96 at the left end in the X-axis direction decreases. As the whole edge of the rotary movable portion 92 of the variable slit 10 tilts, the slit aperture width changes in proportion to a change in position in the X-axis direction. The dose distribution in the X-axis direction in a shot region on the substrate also depends on the aperture width, as has been described in the first embodiment. FIG. 10 shows the dose distribution in the X-axis direction in a shot region when the variable slit 10 is in the state shown in FIG. 9C. Because the center 101 of the shot region in the X-axis direction matches the fulcrum 94 of the variable slit 10, it is possible to implement a dose distribution having a tilt α. The relationship between the position (rotation angle) of the rotary movable portion 92 of the variable slit 10 and the dose distribution in the X-axis direction in each shot is only be measured and stored in advance in the same way as in FIG. 7 in the first embodiment. The dose distribution in the X-axis direction formed by the variable slit 10 is measured by integrating, in the scanning (Y-axis) direction, the output from a dose detector 27, on a substrate stage, irradiated with slit-shaped light 33 while moving the dose detector 27 step by step in the non-scanning (X-axis) direction. This makes it possible to calculate the relationship between the rotation angle θ of the rotary movable portion 92 of the variable slit 10 and the dose distribution (tilt α) in the X-axis direction.

The procedure of adjusting the dose distribution in each shot region within the substrate plane is the same as that described with reference to FIGS. 8A to 8D in the first embodiment. The target dose in each shot region is calculated based on an array of shots 1 to 46 shown in FIG. 8A, and the quadratic polynomial function model (equation 1). Based on, for example, the information on the positions and viewing angles (sizes) of the shots (shots 1 to 46), the main controller 3 of the scanning exposure apparatus calculates tilts α[shot 1] to α[shot 46] of the target dose distributions, in the X-axis direction, which pass through the centers of respective shot regions. Next, based on the information on the relationship between the rotation angle of the rotary movable portion 92 of the variable slit 10 and the dose distribution (tilt α) which is measured and stored in advance, the main controller 3 calculates rotation angles θ[shot 1] to θ[shot 46] of the rotary movable portion 92 of the variable slit 10 for respective shot regions. As a matter of course, the dose distribution may be measured for each shot using the dose detector 27, described previously, to determine the rotation angle θ for each shot.

To perform a scan exposure of the Nth shot region to light by the step & scan scheme, the rotary movable portion 92 of the variable slit 10 is positioned at the rotation angle θ[shot N], which is calculated previously. After that, the execution of a scan exposure of the Nth shot region to light makes it possible to obtain a target dose distribution tilt-α[shot N] in the non-scanning (X-axis) direction for each shot region.

Figure 11A:
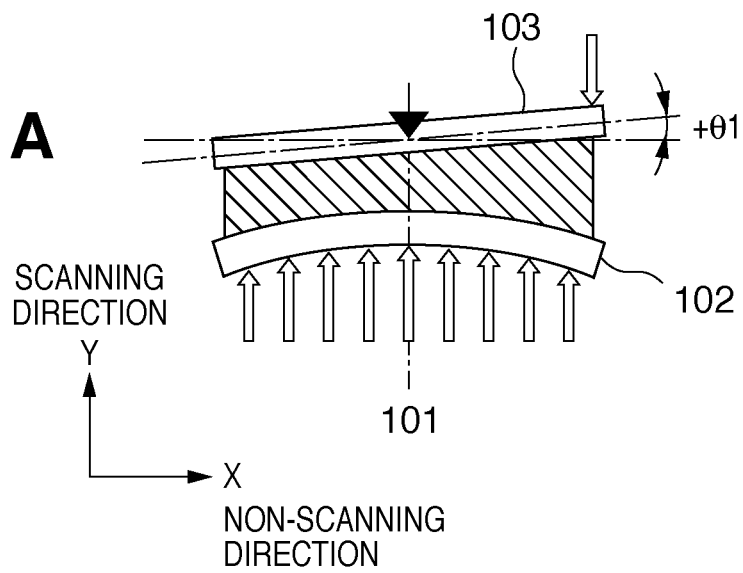
FIGS. 11A and 11B are views showing the arrangement of a variable slit and the dose distribution according to another embodiment.
Figure 11B:
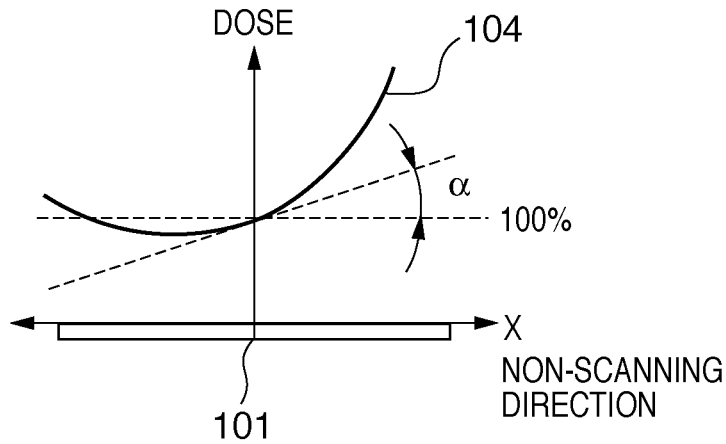

FIG. 11A shows an arrangement formed by combining the variable slit movable portions in the first and second embodiments. A movable portion 102 serves as a light-shielding member with a leaf spring shape described in the first embodiment. The movable portion 102 has its edge deformed by a plurality of pushrods to control the aperture width. On the other hand, a movable portion 103 serves as a rotary movable portion which controls the aperture width distribution upon rotating about the center 11 as the fulcrum in the non-scanning (X-axis) direction, which has been described in the second embodiment. Combining the curved movable portion 102 and rotary movable portion 103 makes it possible to obtain the dose distribution as shown in FIG. 11B. The curve profile of a dose distribution 104 describes a dose distribution which can be controlled by the movable portion 102. Also, the curve profile of the dose distribution 104 is the one obtained by the method, described in the first embodiment, when the rotation angle of the rotary movable portion 103 is θ=0. Furthermore, the curved dose distribution can be tilted by the tilt a by rotating the rotary movable portion 103 through the rotation angle θ1.

Assume that an array of shots 1 to 46 shown in FIG. 8A is exposed by the step & scan scheme. In this case, a pattern line width error attributed to a drawing error on a reticle can be corrected as a component common to shots 1 to 46 by, for example, a curved dose distribution formed using the curved movable portion 102. Further, a pattern line width error attributed to a quadratic curve resist surface shape (resist film thickness distribution) on the substrate can be corrected by, for example, a tilted linear dose distribution formed using the rotary movable portion 103.

An arrangement which adjusts the dose distribution in a direction (X-axis direction) perpendicular to the scanning direction in accordance with a target dose distribution to improve line width uniformity has been explained in the above-mentioned embodiments. When the dose distribution in the scanning direction (Y-axis direction) is adjusted, the intensity of pulsed light which reaches the substrate is only be controlled in accordance with a target dose distribution to improve line width uniformity, depending on the position of a substrate stage in the scanning direction or its corresponding time. A main controller 3 and laser controller 2 as mentioned above, for example, can realize this control.

A method of manufacturing devices (e.g., a semiconductor device and a liquid crystal display device) according to one embodiment of the present invention will be exemplified next.

A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate.

Although embodiments of the present invention have been described above, the present invention is not limited to these embodiments, and various modifications and changes can be made without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-296037, filed Nov. 19, 2008, which is hereby incorporated by reference herein in its entirety.

What is claimed is:

1. An apparatus which scans an original and a substrate relative to slit-shaped light on the original and on the substrate to expose each of shot regions on the substrate to light via the original, the apparatus comprising:

an adjusting device configured to adjust a distribution of a width of the slit-shaped light, the width being a width in a scanning direction as a direction of the scanning, the distribution being a distribution in a perpendicular direction as a direction perpendicular to the scanning direction, the adjusting device including a pair of light-shielding members, and an actuator configured to tilt at least one of the pair of light-shielding members relative to the perpendicular direction to adjust the distribution of the width; and a controller configured to control the adjusting device, wherein the controller is configured to obtain information representing a relationship between a position on the substrate and a target dose, calculate a distribution of the target dose in the perpendicular direction with respect to each of the shot regions by approximating the relationship represented by the obtained information with a function that is linear with respect to a variable representing a position in the perpendicular direction, and control the adjusting device so as to achieve the calculated distribution of the target dose, approximated with the linear function, with respect to each of the shot regions.

2. The apparatus according to claim 1, wherein the information includes information on an expression representing a relationship between a target dose and a coordinate in a coordinate system having an origin at a center of the substrate.

3. The apparatus according to claim 1, further comprising:

a substrate stage configured to hold the substrate and to be moved; and a detector arranged on the substrate stage and configured to detect a dose, wherein the controller is configured to control the adjusting device based on the calculated distribution of the target dose, and information representing a relationship between a distribution of a dose in the perpendicular direction measured using the detector and the distribution of the width.

4. The apparatus according to claim 1, wherein the actuator is configured to tilt an aperture edge of one of the pair of light-shielding members, and to displace at least a part of an aperture edge of the other of the pair of light-shielding members in the scanning direction so as to deform the aperture edge of the other into a curved shape.

5. A method comprising:

exposing a substrate to light using an apparatus;

developing the exposed substrate; and processing the developed substrate to manufacture a device, wherein the apparatus is an apparatus which scans an original and a substrate relative to slit-shaped light on the original and on the substrate to expose each of shot regions on the substrate to light via the original, the apparatus comprising:

an adjusting device configured to adjust a distribution of a width of the slit-shaped light, the width being a width in a scanning direction as a direction of the scanning, the distribution being a distribution in a perpendicular direction as a direction perpendicular to the scanning direction, the adjusting device including a pair of light-shielding members, and an actuator configured to tilt at least one of the pair of light-shielding members relative to the perpendicular direction to adjust the distribution of the width; and a controller configured to control the adjusting device, wherein the controller is configured to obtain information representing a relationship between a position on the substrate and a target dose, calculate a distribution of the target dose in the perpendicular direction with respect to each of the shot regions by approximating the relationship represented by the obtained information with a function that is linear with respect to a variable representing a position in the perpendicular direction, and control the adjusting device so as to achieve the calculated distribution of the target dose, approximated with the linear function, with respect to each of the shot regions.

\* \* \* \* \*